United States Patent

Herbster et al.

Patent Number: 6,002,300
Date of Patent: Dec. 14, 1999

[54] CONTROL SYSTEM FOR THE LINEARIZATION OF AN AMPLIFIER CIRCUIT

[75] Inventors: Guenther Herbster; Friedrich Schumacher, both of Munich, Germany

[73] Assignee: Siemens Aktiengesellschaft, Munich, Germany

[21] Appl. No.: 09/138,047

[22] Filed: Aug. 21, 1998

[30] Foreign Application Priority Data

Aug. 22, 1997 [DE] Germany ............... 19736660

[51] Int. Cl.$^6$ .............. H03F 1/26; H03G 3/20; H01Q 11/12

[52] U.S. Cl. .............. 330/149; 330/136; 455/126

[58] Field of Search .............. 330/107, 109, 330/129, 136, 149; 375/296, 297; 455/126, 127, 108, 109

[56] References Cited

U.S. PATENT DOCUMENTS 3,900,823  8/1975  Sokal et al. .............. 330/149
5,675,288  10/1997  Peyrotte et al. .............. 330/149

FOREIGN PATENT DOCUMENTS

| 0 603 867 A1 | 6/1994 | European Pat. Off. |
| 2 722 350 | 1/1996 | France. |
| 36 36 865 A1 | 12/1987 | Germany. |
| 2 239 755 | 7/1991 | United Kingdom. |
| WO 97/28598 | 8/1997 | WIPO. |

*Primary Examiner*—Robert Pascal
*Assistant Examiner*—Patricia T. Nguyen
*Attorney, Agent, or Firm*—Hill & Simpson

[57] ABSTRACT

A control system for the linearization of an amplifier circuit having a power amplifier operating in the non-linear region for the amplification of an RF input signal. In a modulator a local oscillator is derived from a coupled-out input measurement signal. In a mixer, the local oscillator signal is mixed with the input and output measurement signal to form a respective intermediate-frequency signal. In a detector, level signals are derived from the intermediate-frequency signal and are compared in an amplitude controller. A derived amplitude control signal controls an amplitude controlling element for the linearization of the amplification of the input signal.

10 Claims, 6 Drawing Sheets

CONTROL SYSTEM FOR THE LINEARIZATION OF AN AMPLIFIER CIRCUIT

BACKGROUND OF THE INVENTION

1. Field of the Invention

The present invention relates, generally to a control system for the linearization of an amplifier circuit and, more specifically, to a control system which reduces the distortions of the output signal of a power amplifier operating in the non-linear region in an amplifier circuit.

2. Description of the Prior Art

In radio apparatuses - for example, in the base stations of mobile radiotelephone systems - amplifier circuits are standardly used as output stages for the production of the required transmission power. In order to achieve the highest possible degree of efficiency, the power amplifiers used in the amplifier circuits for the amplification of the RF transmission signals are often driven into the non-linear operating range of the amplifier elements (transistors, traveling magnetic field tubes, etc.). In this non-linear region, there is no proportionality between the input amplitude and the output amplitude of the transmission signal. As a result, amplitude distortions occur. In addition to these amplitude distortions, phase distortions can also occur so that, dependent on the amplitude, a phase displacement can occur between the phase of the input signal and the phase of the output signal (AM-PM conversion). Given transmission signals with chronologically varying envelope (e.g. AM, QAM, CDMA), these two types of distortion lead to a worsening of the quality of the transmission signal to be processed by the receiver as well as to a widening of the transmission spectrum that is not tolerable under certain circumstances.

Therefore, an object of the present invention is to reduce the distortions of the output signal of a power amplifier operating in the non-linear region in an amplifier circuit.

SUMMARY OF THE INVENTION

Such inventive control system is realized in an amplifier circuit having a power amplifier that operates in the non-linear range for the amplification of an RF input signal. In a modulator, a first local oscillator signal is derived from an input measurement signal coupled out from the input signal by means of an input directional coupler. An input mixer mixes the first local oscillator signal with the input measurement signal to form an input intermediate-frequency signal. In an input detector, an input level signal is subsequently derived from the input intermediate-frequency signal. In the same way, in an output mixer, an output measurement signal, coupled out from the output signal by means of an output directional coupler, is mixed with the first local oscillator signal to form an output intermediate-frequency signal. In an output detector, an output level signal is derived from the output intermediate-frequency signal. In at least one amplitude controller, an amplitude control signal is derived by means of a comparison of the input level signal with the output level signal and, by means of this amplitude control signal, at least one amplitude controlling element is controlled for the linearization of the amplification of the input signal. The amplitude controller, as well as the amplitude controlling element, thereby can be multiply realized in the control arrangement.

The advantageous combination of the features of the present invention has the effect that the amplification characteristic of the amplifier circuit is as constant as possible. This is particularly important in the transition of the linear amplification characteristic into the non-linear saturation range, in order to achieve higher efficiency and to drive the power amplifier into the compression range.

The intermediate-frequency signals produced in the input and output mixers have frequencies which are smaller than the frequencies of the RF input and output signals and can be processed by the detector means. In this way, it is possible to control input signals with a frequency above the limit frequency of the detector, wherein it is further possible, for example, to control even those input signals having frequencies above 500 MHZ; which corresponds to the limit frequency of a detector according to the prior art. The frequencies of the intermediate-frequency signals are identical since they are derived respectively from the first local oscillator signal and from the input and output signals. Influencing factors that occur, such as frequency jumps of the input signal or frequency fluctuations of the first local oscillator signal, are compensated for by this arrangement.

Due to the mixing of the first local oscillator signal with the input and output measurement signals in the input and output mixers, the derived intermediate-frequency signals adjacent to the detector are not dependent on the frequency of the input signal. In this way, the level signals at the output side of the detector advantageously correspond very precisely to the powers of the input signal or, respectively, output signal. In connection with the amplitude controlling element, the comparison of the two level signals in the amplitude controller advantageously enables a very exact controlling of the gain of the amplifier circuit.

According to one embodiment of the present invention, the control system also includes a phase controller for the derivation of a phase control signal from a comparison of the phase angle of an input phase signal, derived in the input detector from the input intermediate-frequency signal, with the phase angle of an output phase signal derived in the output detector from the output intermediate-frequency signal. By means of the phase control signal, a phase controlling element is controlled for controlling the phase angle of the input signal before amplification by the power amplifier, wherein the occurring amplitude-dependent phase difference is also advantageously compensated for. The phase controller and the phase controlling element thereby can be multiply realized in the control system.

According to another embodiment of the present invention, the output measurement signal is dampened by one damping factor by means of an amplification adjuster connected before the output mixer. This output measurement signal is supplied to the output mixer as an amplification adjustment signal. The gain of the power amplifier can be set by means of modification of this damping factor. By employing these measures, the gain of the power amplifier becomes amplitude-independent within a relatively large range. The very precise control of the output amplitude advantageously enables the power amplifier to be driven very highly into the non-linear operating range and to be operated with a high average efficiency.

In a further embodiment of the present invention, a band-pass filter is respectively connected after both the input mixer and the output mixer wherein the filter filters the respective intermediate-frequency signal. A limiting of the intermediate-frequency signals takes place in the detector which advantageously serves to minimize systematic errors of the detector. Such errors include the deviation from the linear relation between the level signals and either the measured input power or output power adjacent to the detectors. In addition, a loop filter is respectively connected after the amplitude controller and/or the phase controller, which filter filters the amplitude control signal or, respectively, the phase control signal and controls the amplitude controlling element or, respectively, the phase controlling element according to the desired dynamic behavior of the control system.

If the input signal to be amplified is a frequency-modulated or phasemodulated signal, i.e., there is no frequency mixture in the input signal, the filter outlay of the control arrangement can be kept low. Measures for avoiding or compensating overtones can be omitted and economical narrow-band circuit components, as known from GSM or DECT systems, can be used. Since, except for the controlling elements, a considerable part of the system operates in the intermediate-frequency range, economical components likewise can be used for detection and controlling.

According to yet another embodiment of the present invention, the control system advantageously includes an additional input detector for detecting the input intermediate-frequency signal and an additional output detector for detecting the output intermediate-frequency signal. In a respective combination section, the input level signal is combined with the output signal of the additional input detector, and the output level signal is combined with the output signal of the additional output detector. The input detector and the output detector are thereby respectively realized as a logarithmic detector, and the additional input and output detectors are respectively realized as a diode detector.

Logarithmic detectors have the feature that, for small signals to be detected, they have as high a resolution as for powerful signals. This proves to be particularly advantageous given high dynamic demands on the control system and the amplifier circuit, particularly as used in the output stages of radio equipment. In contrast, diode detectors have a high detector steepness, but a low dynamic. If the level signals of the logarithmic input or, respectively, output detectors and the output voltages of the additional input or, respectively, output detectors are combined or, respectively, added in the combination section, the summation characteristics include the high steepness of the additional diode detector at high powers and include the dynamic of the logarithmic detector at low powers. As such, the overall dynamic of the overall detection is advantageously increased.

Additional features and advantages of the present invention are described in, and will be apparent from, the Detailed Description of the Preferred Embodiments and the Drawings.

DETAILED DESCRIPTION OF THE PREFERRED EMBODIMENTS

Figure 1:
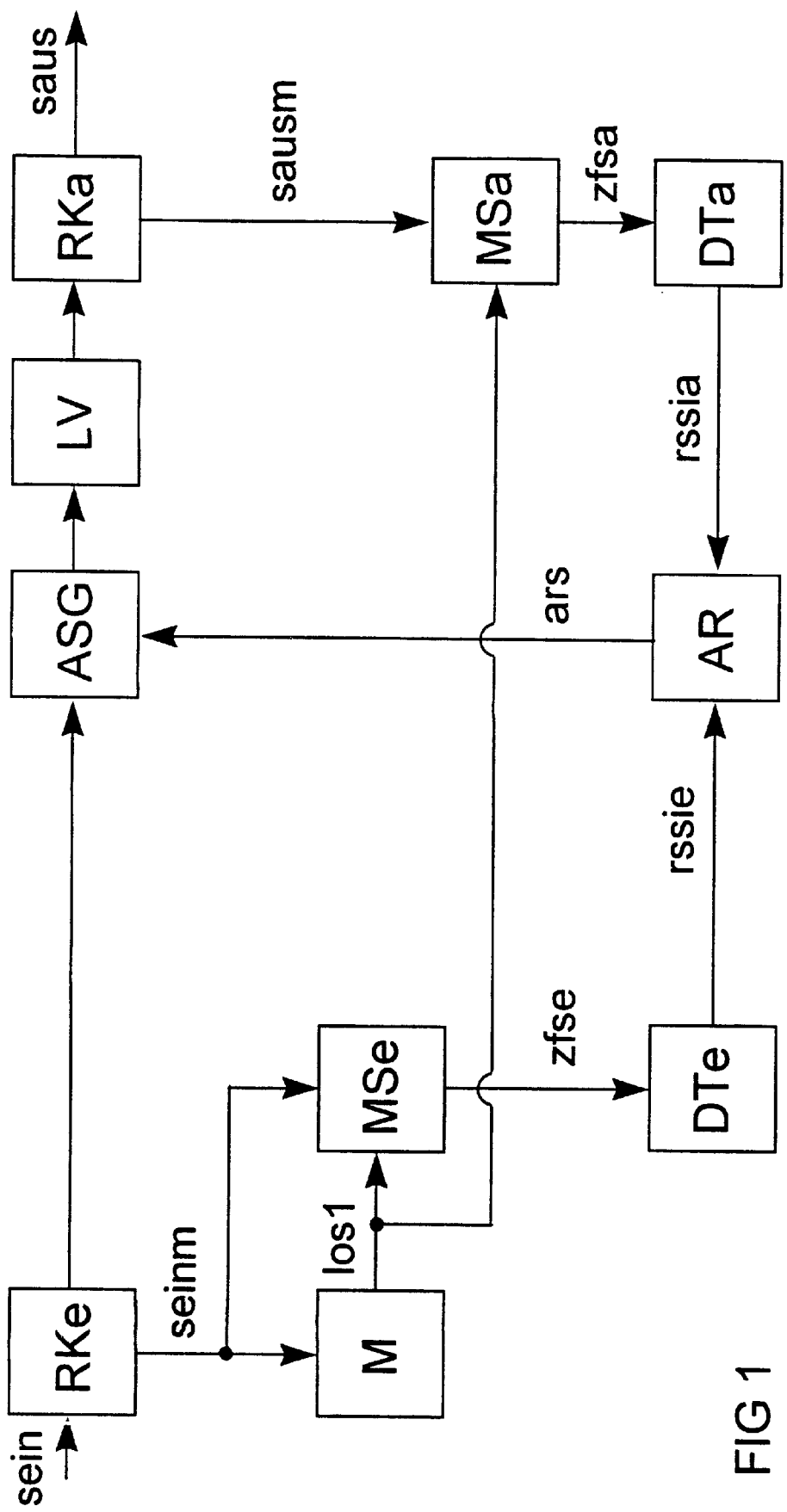
FIG. 1 shows a block switching diagram of a control system in accordance with a first embodiment of the present invention.

The embodiment shown in FIG. 1 shows a control system in an amplifier circuit with a power amplifier LV for the amplification of an RF input signal sein into an RF output signal saus. In, respectively, an input directional coupler RKe and an output directional coupler RKa, low power portions of the input signal sein or, respectively, of the output signal saus are coupled out as input measurement signals seinm or, respectively, as output measurement signals sausm. The input measurement signal seinm is supplied both to an input mixer MSe and to a modulator M in which a first local oscillator signal LOS1 is derived from the input measurement signal seinm. In the input mixer MSe and the output mixer MSa, the first local oscillator signal los1 is mixed with the input measurement signal seinm or, respectively, with the output measurement signal sausm. Intermediate-frequency signals zfse and zfsa, derived from the mixing process in the input mixer MSe and output mixer MSa, respectively, have frequencies that are identical with the frequency of a local oscillator OZ in the modulator M. Thus, they are independent of the frequency of the input signal sein or, respectively, of the output signal saus. The intermediate-frequency signals zfse and zfsa typically have frequencies smaller than the frequency of the input signal sein or, respectively, of the output signal saus, so that successful controlling can take place even given input signals sein with frequencies greater than the limit frequency of the detectors DTe and DTa, in which the intermediate-frequency signals zsfe and zsfa are subsequently detected and evaluated.

The detectors DTe and DTta are fashioned as detectors which are sensitive over a broad power range, e.g. as logarithmic detectors. As a result of the power detection, an input level signal rssie and an output level signal rssia are present, which are compared in an amplitude controller AR. An amplitude control signal ars is derived from the difference of the two level signals rssie and rssia, which control signal drives an amplitude controlling element ASG connected before the power amplifier LV. Accordingly, the amplitude control circuit for the linearization of the amplification of the input signal sein is closed.

The amplitude controlling element ASG can be constructed as an electrically controllable damping element in which the input signal sein is damped or as a preamplifier with electrically adjustable gain in which the input signal sein is pre-amplified. The amplitude controlling element ASG has a useful linear relation between the voltage of the amplitude control signal ars and either the amplification or damping in order to obtain a dynamic behavior of the control circuit that is as constant as possible. The amplitude controlling element ASG enables a linearization of the relation between the input amplitude and the output amplitude of the transmission signal, given operation of the power amplifier LV in the non-linear region.

Figure 2:
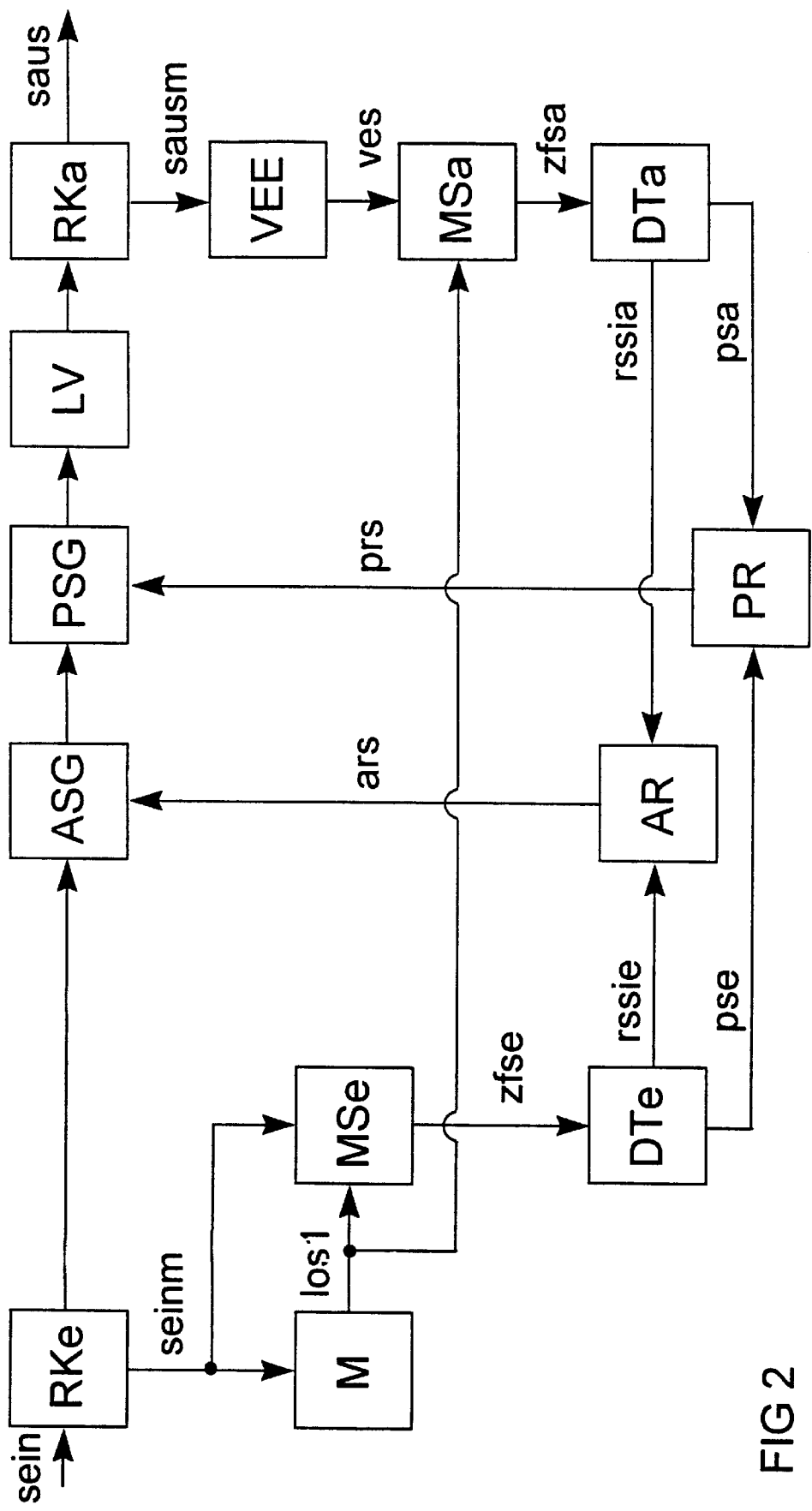
FIG. 2 shows a block switching diagram of a control system in accordance with a second embodiment of the present invention.

The control system shown in FIG. 2 corresponds to the control system of FIG. 1, but is additionally designed for controlling the phase angle of the input signal sein. An input phase signal pse or, respectively, output phase signal psa is derived from the respective intermediate-frequency signal zfse and zfsa in the input detector DTe or, respectively, the output detector DTa. From the difference of the phase angles of the input phase signal pse and the output phase signal psa, a phase controller PR derives a phase control signal prs, to control a phase controlling element PSG which, in turn, controls the phase of the input signal sein before amplification by means of the power amplifier LV.

The control system for controlling the phase angle of the input signal sein brings it about that the amplitude-dependent phase error which occurs in the power amplification is compensated; i.e., the phase difference between the input signal sein and the output signal saus is kept constant. The phase controlling element PSG has a useful linear relation between the voltage of the control signal and the phase displacement in order to obtain a dynamic behavior of the control circuit that is as constant as possible.

In addition to the means already specified, the control system includes an amplification adjustment section VEE that derives an amplification adjustment signal ves from the output measurement signal sausm. In this amplification adjustment section VEE, the output measurement signal sausm is damped by a damping factor and is supplied to the output mixer MSa as an amplification adjustment signal ves. By changing the damping in the amplification adjustment section VEE, for example by means of an actuating signal, a precise setting of the gain of the amplifier circuit is possible.

Figure 3:
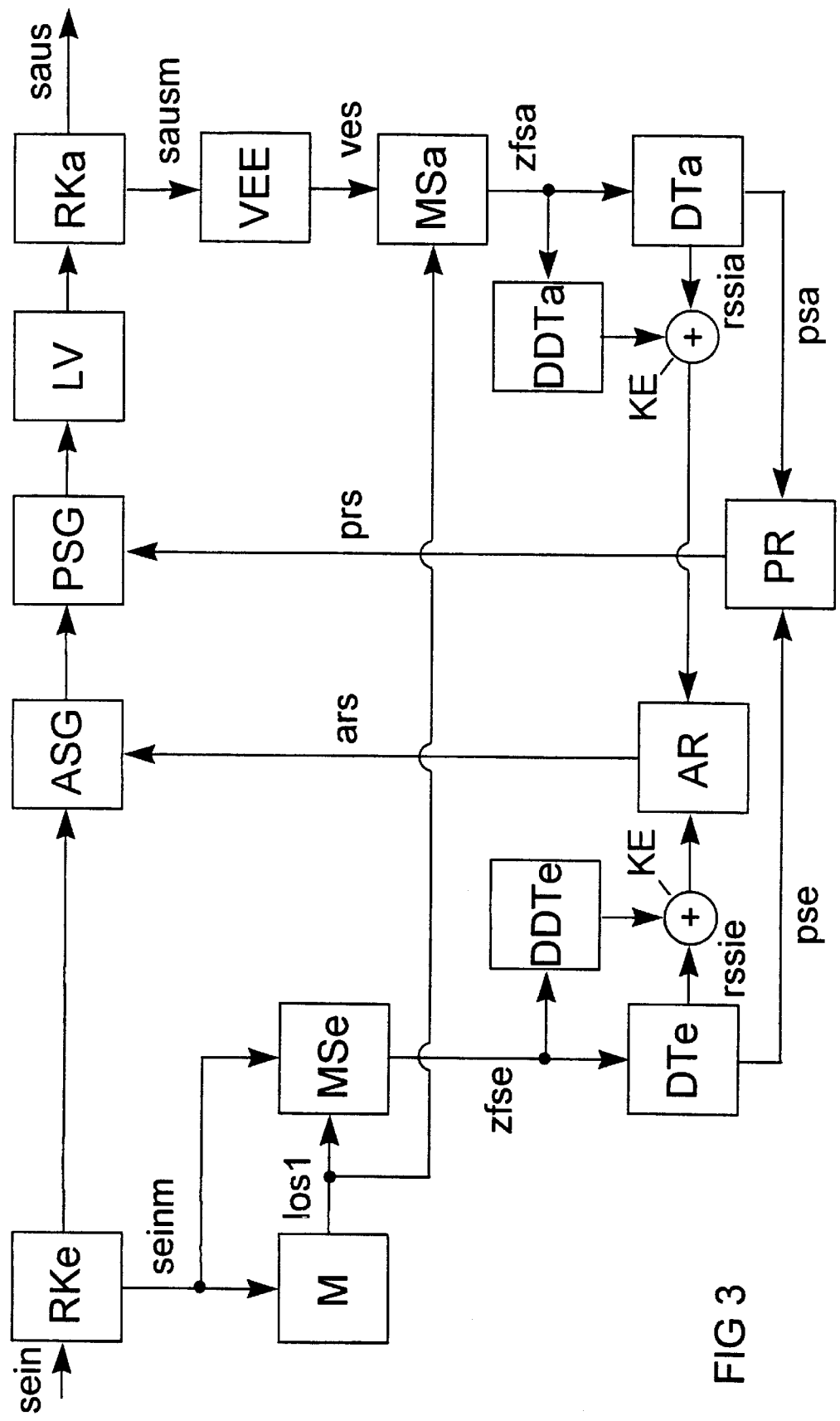
FIG. 3 shows a block switching diagram of a control system in accordance with a third embodiment of the present invention.

The control system shown in FIG. 3 is based on the control system from FIG. 2 in which a linearization of the gain and a controlling of the phase angle of the input signal sein are carried out in parallel. In addition, however, the embodiment shown in FIG. 3 includes an additional input detector DDTe or, respectively, an additional output detector DDTa arranged parallel to the specified input detector DTe and output detector DTa. The additional detectors DDTe and DDTa are thereby constructed as diode detectors. A diode detector has a high detector steepness but only a low dynamic. If the output voltages of the logarithmic input detector DTe or, respectively, output detector DTa and the output voltages of the additional input diode detector DDTe or, respectively, output diode detector DDTa are combined in a respective combination section KE, summation characteristics result which, at high powers, include the high steepness of the diode detectors DDTe or, respectively, DDTa, and which include the dynamic of the logarithmic detector DTe or, respectively, DTa at low powers. Accordingly, the overall dynamic of the overall detection of the control system is increased.

Figure 4:
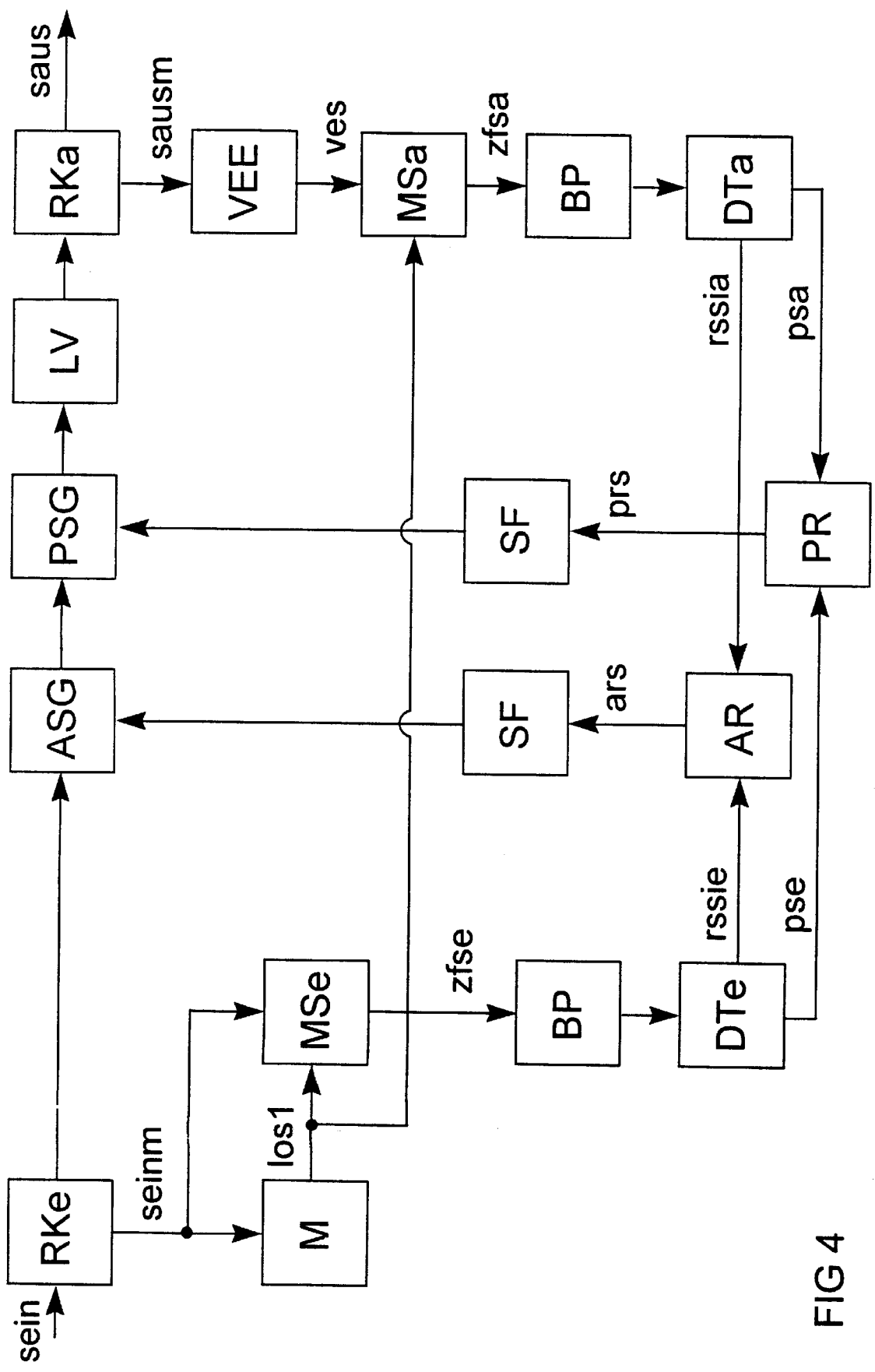
FIG. 4 shows a block switching diagram of a control system in accordance with a fourth embodiment of the present invention.

The control system indicated in FIG. 4 is based on the specified control system of FIG. 2, expanded by two band-pass filters BP respectively connected before the detectors DTe and DTa. These band pass filters BP serve to filter the intermediate-frequency signals zfse and zfsa. A limitation of the intermediate-frequency signals zfse and zfsa takes place in the detectors DTe and DTa. By means of this limitation, the influences of systematic errors in the detectors DTe and DTa, such as deviations from the linear relation between the output voltages of the level signals rssie and rssia and the logarithm of the input powers of the intermediate-frequency signals zfse and zfsa, can be minimized. In addition, two loop filters SF are used which carry out a filtering of the control signals ars and prs and control the controlling elements ASG and PSG according to the desired dynamic behavior of the amplitude control loop or, respectively, the phase control loop.

Figure 5:
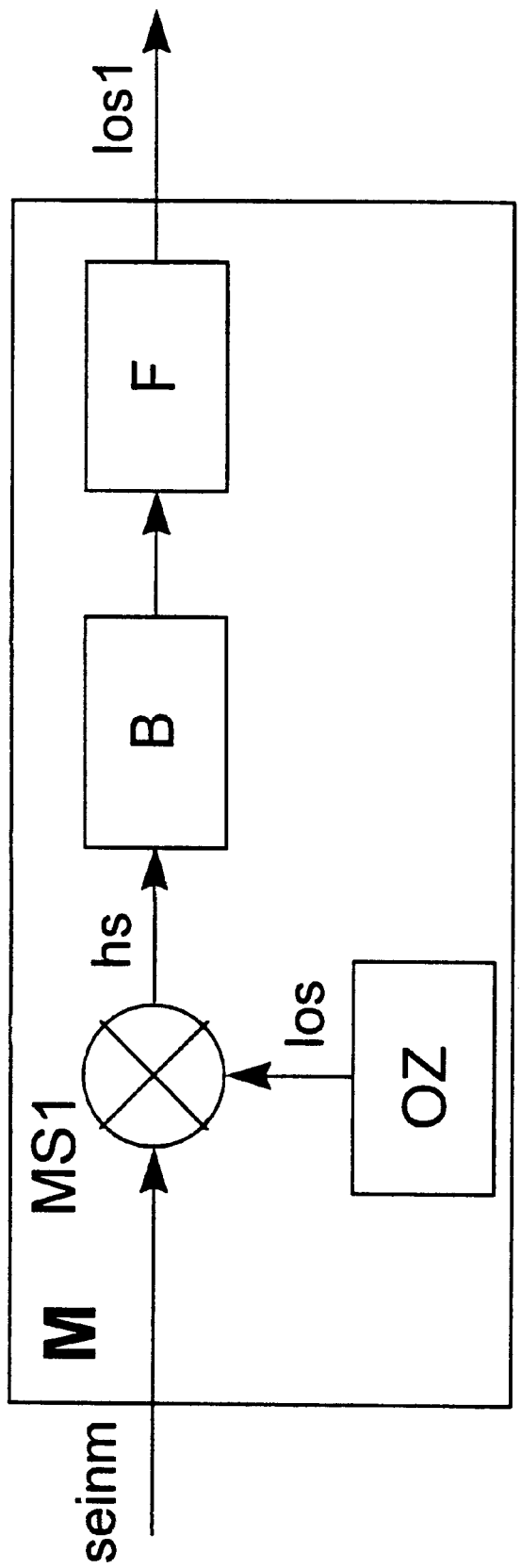
FIG. 5 shows a modulator with double-sideband modulation as taught by the present invention.
Figure 6:
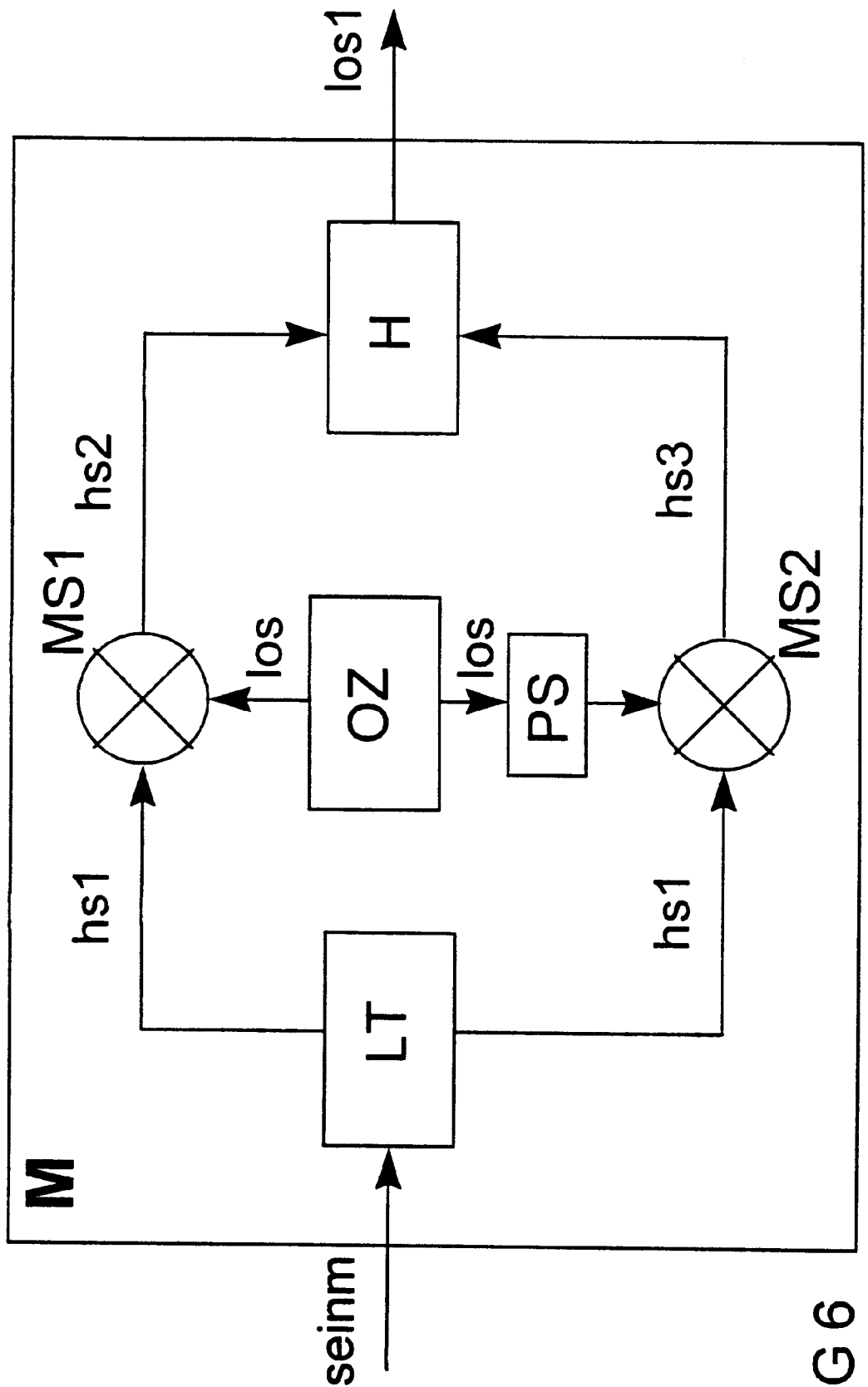
FIG. 6 shows a modulator with single-sideband modulation as taught by the present invention.

In FIG. 5 and FIG. 6, two variants are shown for the construction of the modulator M. The modulator M according to FIG. 5 carries out a double-sideband modulation. A local oscillator OZ generates a local oscillator signal los, which is mixed in a first mixer MS1 with the input measurement signal seinm to form an auxiliary signal hs. This auxiliary signal hs is limited in a subsequent limiter B and its mirror components are removed in a filter F. An output of the filter F supplies the first local oscillator signal los1 for further processing.

According to FIG. 6, the modulator M contains a power divider LT that derives first auxiliary signals hs1 from the input measurement seinm by means of power division. In addition, the modulator M contains a local oscillator OZ which produces for the first auxiliary signal hs1 an in-phase component los and a quadrature component, produced by a phase shifter PS, with 90° displacement. In a first mixer MS1 and second mixer MS2, the local oscillator signal los or, respectively, the phase-displaced local oscillator signal is respectively mixed with the first auxiliary signal hs1, whereby a second auxiliary signal hs2 and a third auxiliary signal hs3 arise. These second and third auxiliary signals hs2, hs3 are combined in terms of power in a hybrid H and yield the first local oscillator signal los1 which serves as an input signal for the input mixer MSe and output mixer MSa.

The modulator arrangement according to FIG. 6 is particularly suited for an intermediate frequency of 10.75 MHZ. In this case, FM receiver modules, for example, can be used for the mixer and the detector DTe and DTa. Complete GSM modulator modules are suitable for the modulator M. The modulator arrangement according to FIG. 5 is suitable for a higher intermediate frequency, preferably 110 MHZ. The mixers MSe and MSa, as well as the detectors DTe and DTa, then can be realized by DECT modules. Using assemblies of this sort, an economical realization of the control system can be achieved. An inventively constructed control system is suited, in particular, for use in radio equipment and as used, for example, in base stations of mobile radiotelephone systems wherein high demands are placed on the linearity of the output signals of the amplifier circuit.

Although the present invention has been described with reference to specific embodiments, those of skill in the art will recognize that changes may be made thereto without departing from the spirit and scope of the invention as set forth in the hereafter appended claims.

I claim as my invention:

1. A control system for the linearization of an amplifier circuit having a power amplifier for the production of an RF output signal from an RF input signal, the system comprising:

a modulator for deriving a first local oscillator signal from an input measurement signal coupled out from the input signal via an input directional coupler;

an input mixer for mixing the input measurement signal with the first local oscillator signal to form an input intermediate-frequency signal;

an input detector for deriving an input level signal from the input intermediate-frequency signal;

an output mixer for mixing an output measurement signal with the first local oscillator signal to form an output intermediate-frequency signal, wherein the output measurement signal is coupled out from the output signal via an output directional coupler;

an output detector for deriving an output level signal from the output intermediate-frequency signal;

at least one amplitude controller for deriving an amplitude control signal by comparing the input level signal with the output level signal; and at least one amplitude controlling element, controlled by the amplitude control signal, for the linearization of the amplification of the input signal.

2. A control system as claimed in claim 1, further comprising:
   at least one phase controller for deriving a phase control signal by comparing a phase angle of an input phase signal, derived in the input detector from the input intermediate-frequency signal, with a phase angle of an output phase signal derived in the output detector from the output intermediate-frequency signal; and
   at least one phase controlling element, controlled by the phase control signal, for controlling the phase angle of the input signal.

3. A control system as claimed in claim 1, further comprising:
   an amplification adjustment section for producing an amplification adjustment signal from the output measurement signal.

4. A control system as claimed in claim 1, further comprising:
   a loop filter connected after the amplitude controller for the filtering of the amplitude control signal.

5. A control system as claimed in claim 1, further comprising:
   a loop filter connected after the phase controller for the filtering of the phase control signal.

6. A control system as claimed in claim 1, further comprising:
   a band-pass filter connected after the input mixer for the filtering of the input intermediate-frequency signal.

7. A control system as claimed in claim 1, further comprising:
   a band-pass filter connected after the output mixer for the filtering of the output intermediate-frequency signal.

8. A control system as claimed in claim 1, further comprising:
   an additional input detector for detecting the input intermediate-frequency signal and an additional output detector for detecting the output intermediate-frequency signal, wherein the input detector and the output detect are realized as a logarithmic detector, and the additional input detector and the additional output detector are realized as a diode detector; and
   a respective combination section for combining the input level signal and the output level signal with the output signals of the additional input detector and the additional output detector.

9. A control system as claimed in claim 1, wherein the modulator for a double-sideband modulation further comprises:
   a mixer for mixing a local oscillator signal, produced in a local oscillator, with the input measurement signal to form an auxiliary signal; and
   a limiter for limiting a filter for removing mirror components of the auxiliary signal and for producing the first local oscillator signal.

10. A control system as claimed in claim 1, wherein the modulator for a single-sideband modulation further comprises:
   a power divider for deriving a first auxiliary signal from the input measurement signal;
   a first mixer for the in-phase mixing of a local oscillator signal, produced in a local oscillator, with the first auxiliary signal to form a second auxiliary signal;
   a second mixer for the phase-displaced mixing of the local oscillator signal, produced in the local oscillator and phase-displaced by a phase shifter, with the first auxiliary signal to form a third auxiliary signal; and
   a hybrid for combining the second and third auxiliary signals to form the first local oscillator signal.

* * * * *